(12) United States Patent
Kling et al.

(10) Patent No.: US 8,067,833 B2
(45) Date of Patent: Nov. 29, 2011

(54) LOW NOISE HIGH THERMAL CONDUCTIVITY MIXED SIGNAL PACKAGE

(75) Inventors: Dennis R. Kling, Milford, MA (US); Bruce William Chignola, Marlborough, MA (US); David J. Katz, Andover, MA (US); Jorge M. Marcial, Sudbury, MA (US); Leonard Schaper, Fayetteville, AK (US)

(73) Assignee: Raytheon Company, Waltham, MA (US)

( * ) Notice: Subject to any disclaimer, the term of this patent is extended or adjusted under 35 U.S.C. 154(b) by 152 days.

(21) Appl. No.: 12/508,106

(22) Filed: Jul. 23, 2009

(65) Prior Publication Data

US 2011/0018126 A1   Jan. 27, 2011

(51) Int. Cl.
*H01L 23/34* (2006.01)
(52) U.S. Cl. .................. 257/704; 257/713; 257/E21.511
(58) Field of Classification Search .................. 257/704, 257/712, 713, 723, 760, E23.08, E21.511
See application file for complete search history.

(56) References Cited

U.S. PATENT DOCUMENTS

| | | | |
|---|---|---|---|
| 5,866,943 A | * | 2/1999 | Mertol .......................... 257/712 |
| 7,335,987 B2 | * | 2/2008 | Huang .......................... 257/734 |

* cited by examiner

*Primary Examiner* — Roy Potter
(74) *Attorney, Agent, or Firm* — Daly, Crowley, Mofford & Durkee, LLP

(57) ABSTRACT

An improved microelectronic assembly (100) and packaging method includes a device package for housing a semiconductor die or chip, (105), an array of passive electronic components (305-355) operating in cooperation with the flip chip semiconductor die (105) and housed inside the device package to decouple noise from input signals, and a heat spreader (195) disposed between a top surface of the semiconductor die (105) and a package cover (185). The semiconductor die (105) is configured as a flip chip die and the device package includes a package substrate (110) configured as a ball grid array. The improved microelectronic device (100) reduces parasitic inductance in electrical interconnections between the semiconductor die and an electrical system substrate (115) and reduces signal noise in mixed signal high frequency analog to digital converters operating at clock rates above 1 GHz.

27 Claims, 5 Drawing Sheets

LOW NOISE HIGH THERMAL CONDUCTIVITY MIXED SIGNAL PACKAGE

BACKGROUND OF THE INVENTION

1. Field of the Invention

The present invention relates to an improved microelectronic assembly and packaging method. In particular, the improved microelectronic assembly includes a device package for housing a semiconductor die or chip, an array of passive electronic components operating in cooperation with the semiconductor die and housed inside the device package, and a diamond heat spreader in contact with the semiconductor die to improve the flow of heat.

2. Description of the Related Art

Electronics systems assembled on a circuit substrate, e.g. a printed circuit board, (PCB), or the like, generally include one or more microelectronic assemblies and a plurality of passive electronic components surface mounted onto the PCB. The microelectronic assemblies and passive components are electrically interconnected by "PCB interconnections" comprising a series of conductive pathways such as conductive planes or conductive runs or buses on various layers of the PCB and interconnected by via holes, and the like. Typically, each microelectronic assembly includes one or more integrated circuits, (IC's), formed on a semiconductor die or chip and a device package comprising a housing or enclosure surrounding the chip to mechanically support the chip and protect the chip from damaging mechanical and electrical shock, contaminates and moisture. In addition, the device package may block damaging electromagnetic radiation transmission and facilitate thermal energy dissipation. Moreover, the device package includes "package interconnections" comprising a series of conductive elements forming conductive pathways that extend from the semiconductor chip to the PCB for electrically interconnecting the IC's with the electrical system.

In many electrical systems, passive components are incorporated into the system to correct unavoidable shortcomings of system performance. In particular, passive components such as resistors, capacitors and inductors filter signal noise, damp circuit resonances and stabilize signal frequencies. An important example of such a correction is a decoupling circuit. Decoupling circuits are typically used in association with high frequency digital logic and mixed signal circuits such as computer mother boards, digital cameras, and other digital imaging systems.

Typically, the decoupling circuit comprises one or more capacitors electrically interconnected between a power distribution system or power supply and an IC, such as an analog to digital converter (ADC), housed inside a microelectronic assembly. Digital circuits have high power demands synchronized with clock pulses and a low power demand between clock transitions. This occurs because clock pulses initiate millions of logic steps all drawing power simultaneously. The decoupling capacitors store charge between clock pulses and deliver the charge when the clock pulse occurs. This decouples power supply switching noise and other transients from IC signals and maintains a substantially uniform input supply voltage.

As input signal and IC clock frequencies increase, the number of decoupling capacitors needed to decouple power supply transients also increases to the point that high frequency mixed signal IC's may require as many as 50 decoupling capacitors taking up valuable space on the PCB. Generally, there is a need in the industry to reduce the number of passive components on PCB's and especially on space limited PCB's used in small devices such as a hand held device, e.g. cell phones, and other consumer electronic products.

Another problem associated with the use of capacitors on PCB's is that capacitors interact with the parasitic or self inductance and resistance inherent in the conductive pathways electrically interconnecting the capacitors with the IC's. The parasitic inductance and resistance when combined with the capacitance of the decoupling capacitors act like an R-L-C network having resonant frequencies and harmonics capable of injecting additional noise into IC input signals and possibly capable of damaging the IC and/or adversely affect circuit performance. In particular, "PCB interconnections" and "package interconnections" have "self inductance" or "parasitic inductance" that interacts with decoupling capacitors to form an R-L-C network. Moreover, the magnitude of the reactance (i.e., the impedance due to the parasitic inductance) is proportional to the input signal frequency with the reactance increasing with increasing input signal frequency. In particular, it is known that special decoupling circuits for IC's operating with input signals having a frequency above 50 MHz require multiple fast acting decoupling capacitors operating in parallel in order to keep up with charge demands. Recently, as input signal frequencies begin to exceed 1 GHz, the interaction of decoupling capacitors with the parasitic inductance of PCB and package interconnections have become problematic as the R-L-C networks formed by decoupling capacitors on a PCB and package interconnections generate unacceptable signal noise.

Conventional packages are unacceptable for packaging new high speed, high dynamic range (i.e., high signal to noise ratio), high power dissipation, mixed signal die because there are no conventional packages which simultaneously address all 3 of the following requirements: 1) maintain sufficiently low junction temperatures for the high power densities and high overall power dissipation of the new die, 2) contain sufficiently low parasitics in the interconnects within the IC package to achieve a low noise environment and high dynamic range operation in the presence of high speed switching and mixed analog/digital circuitry; and 3) contain adequately short path lengths between the die and critical passive components (such as decoupling capacitors) to minimize parasitics for proper operation of the high speed, high dynamic range circuit.

SUMMARY OF THE INVENTION

The present invention overcomes the problems cited in the prior art by providing a microelectronic assembly that reduces the parasitic inductance of "package interconnections" and eliminates the parasitic inductance of "PCB interconnections" between decoupling capacitors and the microelectronic assembly by housing the decoupling capacitors inside the device package.

The die thermal management problem is addressed by utilizing a high (thermal) conductivity heat spreader and removing the heat through the package lid. This thermal solution is compatible with the low parasitic, short interconnect path length, flip chip die approach, thus solving both the thermal and electrical challenges in one package. The microelectronic assembly solves the problem by combining high density package interconnects, in-package passive components (such as decoupling capacitors), flip chip semiconductor die attach, and a high thermal conductivity heat spreader coupled to a high thermal conductivity lid in a ball grid array package.

In particular, the microelectronic assembly includes a semiconductor die having one or more integrated circuits formed thereon for processing input signals, capacitors for decoupling noise on supply voltage buses and tunable inductors to allow tuning of flip chip component performance. The semiconductor die is packaged in a device package that includes at its base, a package substrate. The package substrate mechanically supports the semiconductor die and electrically interfaces with the integrated circuits formed on the semiconductor die as well as electrically interfacing with an electrical system substrate to receive input signals from a larger electrical system and to deliver the input and output signals to and from the IC. In a preferred embodiment, the semiconductor die comprises a flip chip die having an array of stud bumps extending from its bottom surface and configured as IC I/O ports. Moreover in the preferred embodiment, the package substrate comprises a ball grid array package having an array of solder balls extending from its bottom surface and configured as electrical interconnecting points for electrically interconnecting the device package with an electrical system substrate such as a printed circuit board (PCB).

The device package includes a stiffening member such as a square ring formed by a continuous side wall comprising a metal e.g. stainless steel, copper, aluminum, or other material having a similar stiffness. The continuous side wall has an outer perimeter forming outside edges of the device package and an inner perimeter enclosing a hollow cavity surrounding the semiconductor die. The continuous side wall has a bottom surface fixedly attached to a top surface of the package substrate by an adhesive layer such that the continuous side wall stiffens the package substrate in order to prevent the semiconductor die from bending or twisting which could lead to die and/or stud bump cracking during thermal expansion or handling. The continuous side wall thickness or height above the package substrate exceeds a height of the semiconductor die.

The device package includes a cover fixedly attached to a top surface of the continuous side wall, e.g. by a layer of adhesive. The cover seals the hollow cavity thereby protecting the semiconductor die from contamination and moisture. In addition, the device package includes a heat spreader disposed between a top surface of the semiconductor die and a bottom surface of the cover and in thermal contact with both. The heat spreader is fabricated from a high thermal conductivity material, such as diamond which generally has a thermal conductivity coefficient of over 900 W/m° K at 20° C. The heat spreader has a cross-sectional area that is larger than the cross-sectional area of the semiconductor die but that still fits inside the hollow cavity. It should be noted that in some applications, the heat spreader can provide effective thermal management even if it does not have a surface area larger than the surface area of the top of the die (e.g., in certain applications, it may be advantageous to have the heat spreader surface area equal to the top surface area. The heat spreader functions to conduct thermal energy away from hot spots in the semiconductor die top surface, and to conduct thermal energy toward the cover. Preferably the cover is formed from copper which generally has a thermal conductivity coefficient of over 400 W/m° K at 20° C. and functions to dissipate thermal energy to surrounding air and to conduct thermal energy from the heat spreader to the continuous side wall. The side wall serves to dissipate thermal energy to the surrounding environment.

The device package includes one or more passive electrical components housed inside the hollow cavity. The passive electrical components may include capacitors and or inductors electrically interconnected to the package substrate or to the semiconductor die by ribbon bonded connections. Other electrical interconnections such as wire bonding or solder bumps may be utilized depending on the selected passive components. Certain passive electrical components function to prevent noise from contaminating the die input/output signals and prevent noise from interfering with proper IC operation. More specifically a plurality of decoupling capacitors may be electrically interconnected with power planes and ground planes of the package substrate to decouple signal transients from power supply inputs to the die. In addition, other passive components, such as high Q inductors may also be interconnected with the package substrate in order to realize other circuit functions, such as adjustable resonant filters.

BRIEF DESCRIPTION OF THE DRAWINGS

The features of the present invention will best be understood from a detailed description of the invention and a preferred embodiment thereof selected for the purposes of illustration and shown in the accompanying drawings in which.

DESCRIPTION OF THE PREFERRED EMBODIMENTS

Figure 1:
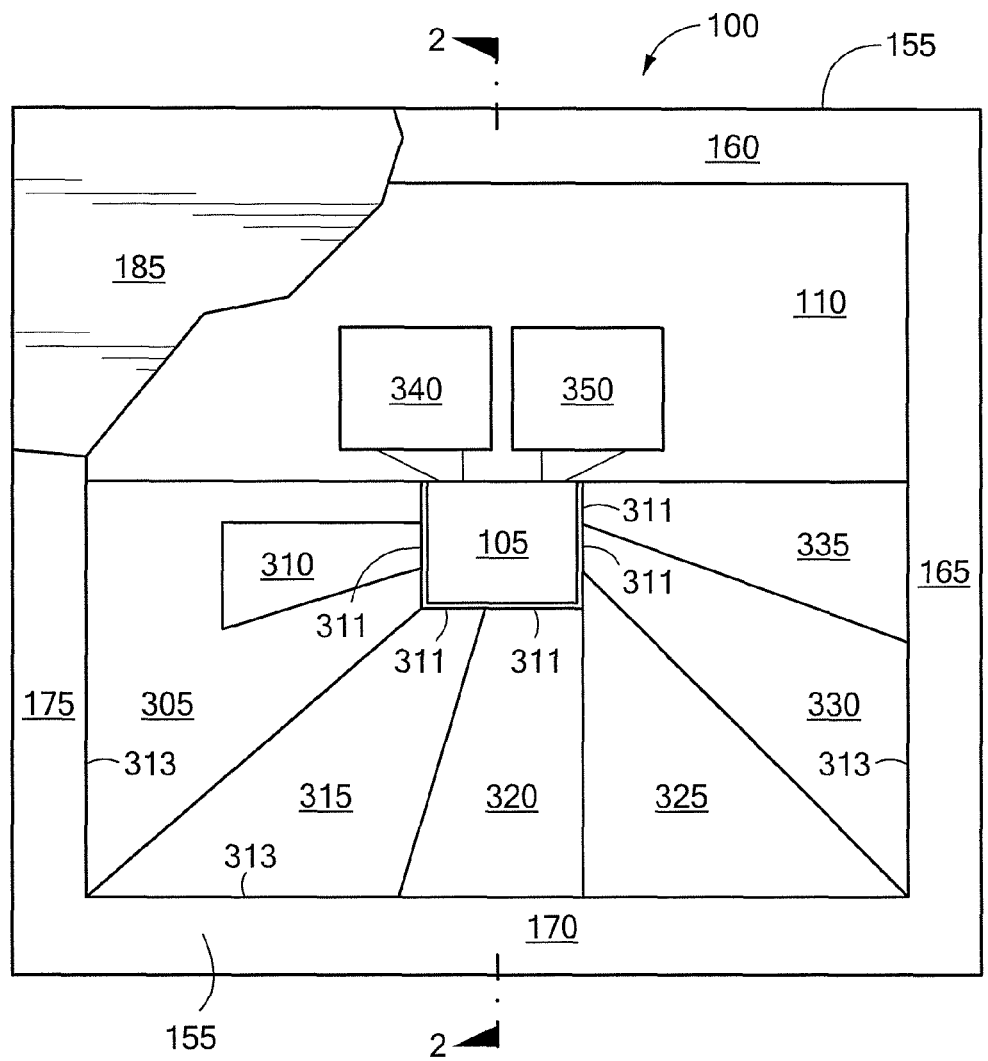
FIG. 1 illustrates a top view of selected elements of a microelectronic assembly according to the present invention.
Figure 2:
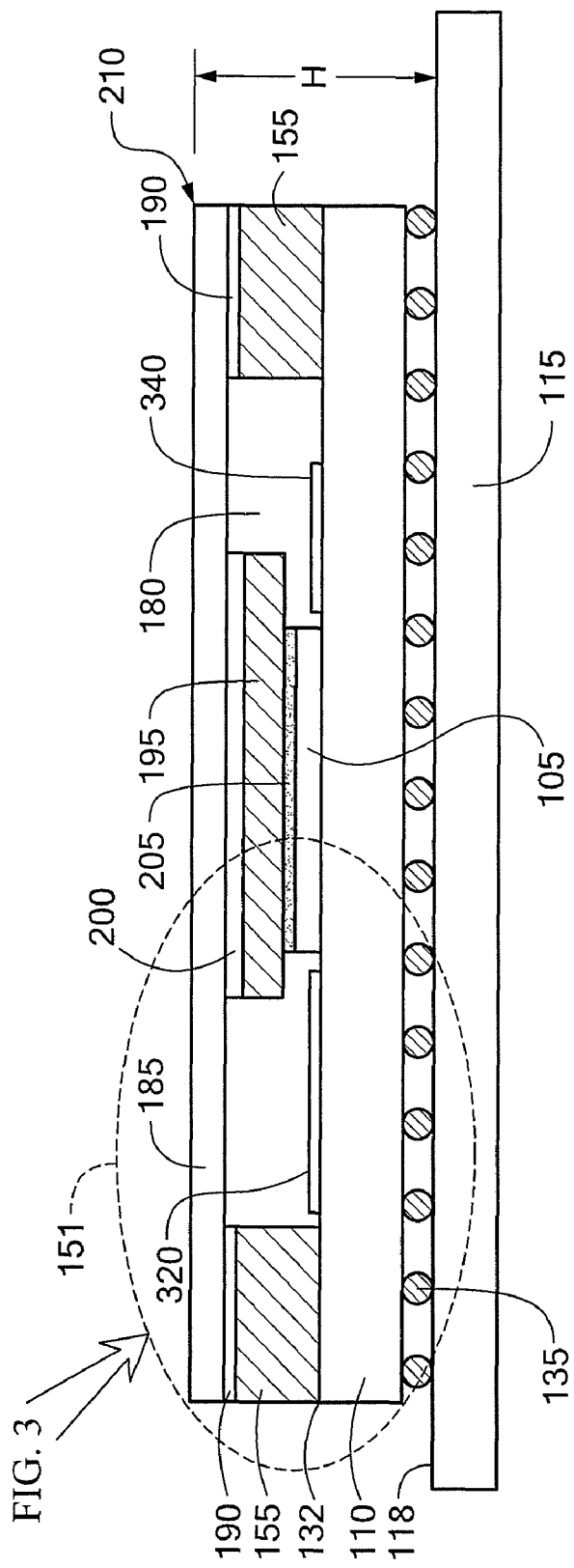
FIG. 2 illustrates a side section view taken along line 2-2 through the microelectronic assembly of FIG. 1 according to the present invention.

Referring to FIGS. 1 and 2, a microelectronic assembly 100 is shown in top view with its cover 185 partially cut away and heat spreader 195 removed. The microelectronic assembly 100 includes a flip chip semiconductor die 105 packaged in a device package 210 that preferably conforms to Joint Electron Device Engineering Council, (JEDEC) standard microelectronic device package dimensions of 25×25 mm square by approximately 2.9 mm thick, but other package dimensions are usable. The microelectronic assembly 100 includes an array of passive decoupling capacitors 305, 310, 315, 320, 325, 330 and 335 housed inside the device package 210 and electrically interconnected with the semiconductor die 105 using low inductance electrical interconnections.

The microelectronic assembly 100 may further include other components, such as an array of tunable, low profile, high frequency or high Q resonator inductors 340 and 350, electrically interconnected with the semiconductor die 105 as part of resonator filter circuits. In addition, the microelectronic assembly 100 is constructed to eliminate wire bonded electrical interconnections between the semiconductor die 105 and a package substrate 110 in order to reduce parasitic inductance. Moreover, the microelectronic assembly 100 is constructed with a diamond heat spreader 195 (FIG. 2) disposed between a top surface of the flip chip semiconductor die 105 and a cover 185 to improve thermal energy management within the device package.

The microelectronic assembly 100 is particularly suitable when the semiconductor device 105 is configured as a mixed signal analog to digital converter (ADC) operating at high frequency. In particular, a preferred semiconductor die 105 includes integrated circuits (IC's) formed thereon for receiving a plurality of alternating current (AC) and variable analog voltage input signals with average input signal variations having frequencies of 1.3 GHz, for converting the input signals to digital values and for outputting equivalent digital signals at an average data rate of 2 Gbits/sec and with a target effective number of bits (ENOB) of 16 and with a target signal to noise ratio (SNR) of 98 dB in a 10 MHz bandwidth. In particular, the preferred ADC includes a clock operating at 3.8 GHz. In addition, the microelectronic assembly 100 is configured to dissipate 16 watts of total power when operating at 60° C.

Figure 3:
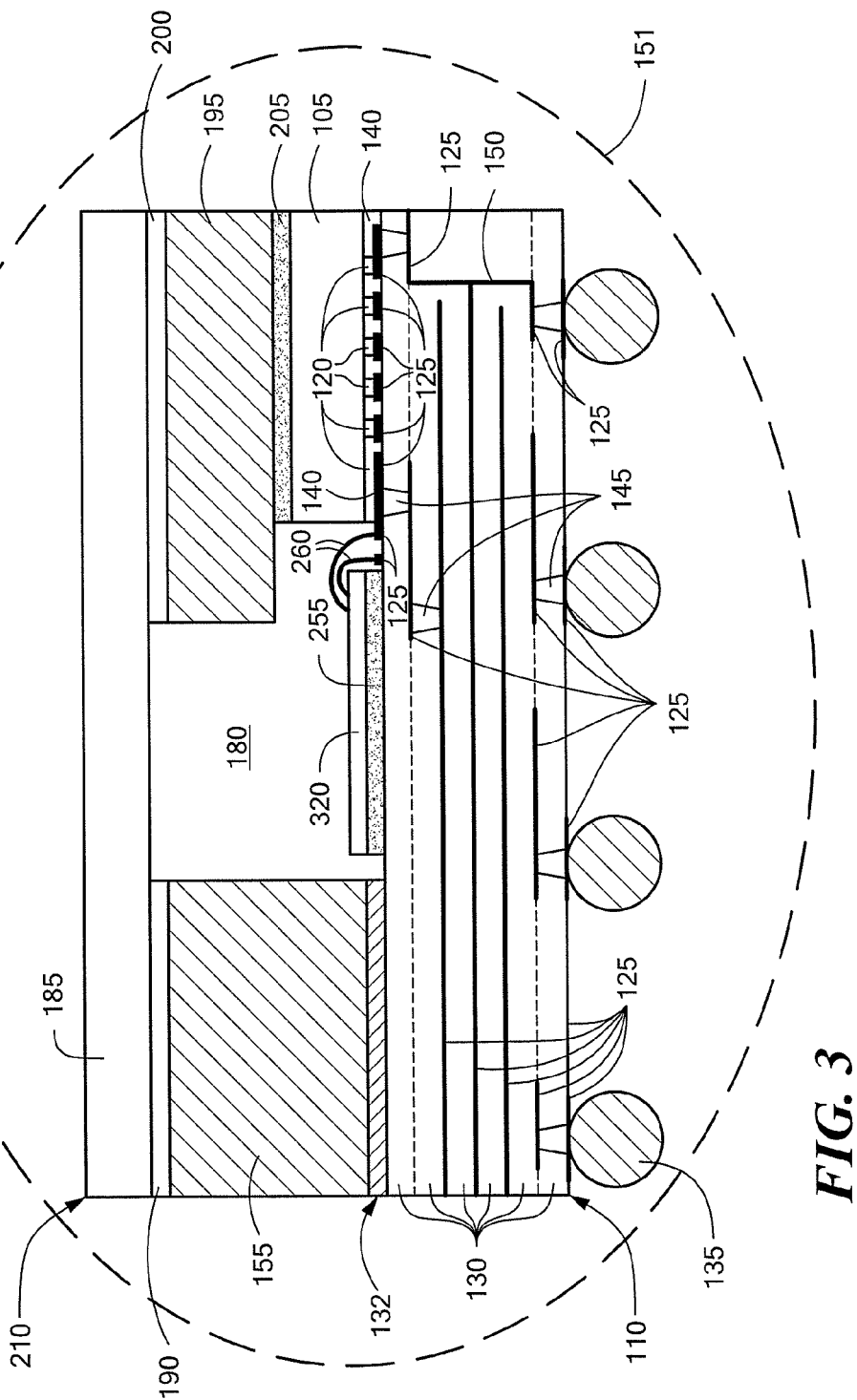
FIG. 3 illustrates an enlarged side section view of FIG. 2 through a portion of a microelectronic assembly according to the present invention.

Referring now to FIGS. 2 and 3, a section view taken through section 2-2 depicts the semiconductor die 105 supported on a package substrate 110, which is further supported on an electrical system substrate 115, (not shown in FIG. 1), such as a printed circuit board, (PCB), or the like. According to a preferred embodiment of the invention, the semiconductor die 105 is electrically interconnected with the package substrate 110 and the package substrate 110 is electrically interconnected with the electrical system substrate 115 without using wire bonded wires or ribbons. In addition, a plurality of passive electrical components, capacitors (305, 310, 315, 320, 325, 330, 335) and dual planar inductors, (340, 350) are supported on the package substrate 110 and electrically interconnected between the semiconductor die 105 and the electrical system substrate 115 via electrical interconnections with the package substrate 110.

The semiconductor die or chip 105 comprises a thin wafer of semiconductor material cut with a square or rectangular cross-sectional area with opposing and substantially parallel top and bottom surfaces. In one example embodiment, the die dimensions are approximately 4.0 mm×4.6 mm by 0.1 mm thick. As described above, the semiconductor die 105 includes one or more integrated circuits (IC's) formed thereon and the integrated circuits include one or more IC input/output ports or gates formed as conductive areas or pads disposed on one or both of the top and bottom surfaces. In a preferred embodiment, the semiconductor die 105 is configured as a flip chip having a plurality of conductive stud bumps 120, e.g. comprising gold or silver, extending from the semiconductor die bottom surface. The stud bumps 120 can be formed in a two dimensional array of substantially uniformly spaced contact elements positioned to mechanically support the semiconductor die 105 on the package support substrate 10 and to electrically interconnect the IC I/O ports to the passive components within the microelectronic assembly and or to the package substrate 115. However, the pattern or array of bumps may be either a uniform or nonuniform spaced array of contact elements.

Referring to FIG. 3, the package substrate 110 comprises a plurality of thin conductive material layers 125 separated by a plurality of thin dielectric or insulating material layers 130. The conductive and dielectric layers are disposed substantially horizontally and the package substrate 110 is formed with a square or rectangular cross-sectional area that exceeds the cross-sectional area of the semiconductor die and preferably has dimensions of 25 mm square. Preferably the conductive material layers 125 comprise copper in an approximate layer thickness of 6-25 µm and the dielectric layers 130 comprise polytetrafluoroethylene, (PTFE) and or polyphenyl ether or polyphenylene, (PPE), in an approximate layer thickness of 25-40 µm.

Generally each conductive layer 125 is laid out in a pattern of conductive pads, conductive planes, runs, buses or other conductive pathways and each dielectric layer 130 separates two adjacent conductive layers 125 to electrically isolate one conductive layer 125 from another. Moreover, the top and bottom surfaces of the package substrate 110 comprise conductive layers 125. In addition to providing an electrical interface between the semiconductor die 105 and the electrical system substrate 115, the package substrate 110 provides enough mechanical stiffness to support the semiconductor die 105 and as will be described below, a stiffening member 155 attaches to the package substrate 110 to prevent the semiconductor die from bending or twisting during handling or during thermal cycling and to support the package cover required for protection of internal components and thermal management. The stiffening member 155 is attached by bonding 132 to the package substrate 110.

The package substrate 110 top surface comprises a conductive layer 125 formed with a plurality of isolated conductive pads, not shown, positioned to interface with each of the stud bumps 120. The package substrate bottom surface comprises a conductive layer 125 formed with a plurality of solder balls 135, e.g. comprising tin, lead and mollified rosin, extending out therefrom. The solder balls 135 are formed in a two dimensional array of uniformly spaced apart elements, (e.g. 576 contacts in a 24×24 array spaced at a 1.0 mm pitch), positioned to mechanically support the device package on the electrical system substrate 115 and to electrically interconnect the package substrate 110 with the electrical system substrate 115. One skilled in the art will recognize that the stud bumps may be made from other materials and that the array size and pitch may vary for other applications.

Preferably each stud bump 120 is attached to the package substrate 110 by conductive epoxy applied between the stud bump 120 and the top surface of the package substrate 110. In addition, a conventional flip chip underfill layer 140, comprising a thermally conductive dielectric or other suitable material, is applied between the semiconductor die 105 and package substrate 110 to improve thermal conductivity from the semiconductor die 105 to the package substrate 110, to fixedly attach the semiconductor die 105 to the package substrate 110, and to prevent die warping caused by forces generated by mismatches in the thermal expansion characteristics and local temperature differences between the die 105 and package substrate 110. Ideally, semiconductor die 105, the package substrate 110 and the underfill layer 140 are constructed from materials having substantially similar thermal expansion characteristics.

Referring to FIG. 2, the electrical system substrate 115 includes a top surface 118 laid out in patterns of conductive pads, conductive planes, runs, buses, or other conductive pathways including a pattern of conductive pads for interfacing with each of the solder balls 135. In addition, the electrical system substrate 115 includes electrical elements mounted thereon or connected thereto for forming one or more electrical systems for operating in cooperation with the microelectronic assembly 100. The solder balls 135 are attached to the electrical system substrate 115 using any number of conventional attaching means such as by heating the solder balls 135 to a solder flow temperature to thereby solder the device package 210 to the electrical system substrate 115. Alternately, a conductive adhesive or other suitable attaching means are usable to attach and electrically interconnect the package substrate 110 to an electrical system substrate 115 without deviating from the present invention.

Referring to FIG. 3, an enlarged section view of area 151 in FIG. 2 shows a portion of the package substrate 110 and other elements in more detail. As shown, each of the conductive layers 125 is electrically interconnected to other conductive layers 125 by blind via holes 145 and or through via holes 150. The via holes 145, 150 extend from one conductive layer 125 to another by passing through one or more dielectric layers 130. The via holes 145, 150 are filled with, or coated around their inside diameters with a conductive material, e.g. copper, to provide a conductive pathway that extends along their longitudinal length. Accordingly, each via hole may electrically interconnect two or more conductive layers 125.

The package substrate 110 is a high density interconnect (HDI) to minimize package parasitics by minimizing inductive loop lengths and by maximizing decoupling capacitance between power and ground in the package interconnect substrate 110. The substrate 110 has short minimum distances between adjacent vias 145, 150, has short minimum distances between traces, and has short height between conductive layers 125.

The conductive layers 125 and via holes 145, 150 are laid out to electrically interconnect each of the stud bumps 120 with one or more conductive layers 125 as well as to electrically interconnect each of the solder balls 135 with one or more conductive layers 125 in a circuit pattern configured to exchange digital data signals, analog signals and power signals between the IC's formed on the semiconductor die 105 and an electrical system formed on the electrical system substrate 115. Conductive layers and vias also interconnect with the passive parts in the device package 210. In the preferred embodiment, each of the different dc voltages and each of the uniquely-designated circuit grounds has at least one large area metal plane on at least one conductive layer 125 to maximize decoupling capacitance, minimize inductance and minimize resistance within the package substrate. More specifically, the microelectronic assembly 100 receives power via seven different power busses delivering seven different input power signals to the semiconductor die 105. Each of the seven different input power signals is delivered to at least one power plane in the package substrate 100. Moreover, the seven different power supplies operate with four different ground levels, and each of the four different ground levels is connected to multiple ground planes in the package substrate 100. However, other conductive layer layouts with different electrical requirements are usable without deviating from the present invention.

Referring to FIGS. 1-3, the device package 210 further includes a support member 155 functioning to stiffen the package substrate 110 and further functioning as a heat sink for storing and dissipating thermal energy to surrounding air. The support member 155 comprises a square ring, e.g. stainless steel, titanium, or copper, formed by a continuous side wall, such as the four side walls 160, 165, 170, 175. The continuous side wall forms an outside perimeter which matches an outside perimeter of the package substrate 110 forming side edges of the device package. The continuous side wall forms an inside perimeter forming side edges of a hollow cavity 180 that surrounds the semiconductor die 105. The support member 155 is fixedly attached to the top surface of the package substrate 110 and functions to further stiffen the package substrate 110. In addition, the support member 155 has a thickness in excess of the thickness of the semiconductor die 105 such that a height of the hollow cavity 180 exceeds the height of the semiconductor die 105 and the diamond heat spreader 195.

In the preferred embodiment, the side walls 160, 165, 170, 175 form an outer perimeter with a square outside dimension of 25×25 mm and an insider inner perimeter with a square inside dimension of 19×19 mm and an approximate thickness of 0.6 mm. This sizes the hollow cavity 180 to enclose the semiconductor die 105, the passive electronic components (305-350) and the heat spreader 195 therein. However, other device package shapes and sizes are usable without deviating from the present invention.

Referring again to FIG. 2, the device package 210 includes a square or rectangular cover 185 sized to approximately match the square or rectangular dimensions of the package substrate 110 and the outer perimeter of the support member walls 160, 165, 170, 175. The cover 185 is supported on a top surface of the support member 155 and attached thereto by a thermally conductive adhesive layer 190. The cover 185 functions to seal the hollow cavity 180 and also as a thermal conduit for drawing thermal energy away from the heat spreader 195, conducting the thermal energy to the stiffening member 155 and dissipating the thermal energy to the surrounding environment. The cover 185 is preferably formed from copper, and other high conductivity materials may be used for the cover.

The device package 210 further includes a heat spreader 195 sandwiched between the semiconductor die 105 and the cover 185. The heat spreader 195 comprise a layer of material such as diamond having a high thermal conductivity that functions to rapidly conduct thermal energy away from the semiconductor die 105 and towards the cover 185. The heat spreader 195 also functions to rapidly spread the thermal energy over its volume. For less demanding applications or where cost is a significant factor, other high thermal conductivity heat spreaders may be utilized such as metal or ceramic-based including CuMo, Copper, BeO, and AlN. Preferably, the heat spreader 195 has a thermal conductivity of $\geqq 900$ W/m° K at 60° C., which is achievable when the heat spreader 195 comprises diamond. Preferably, the heat spreader 195 comprises a square or rectangular plate having a cross-sectional area with dimensions that meet or exceed the cross-section dimensions of the semiconductor die 105 while still fitting with the inside perimeter of the continuous side wall of the stiffening member 155. In particular, a preferred heat spreader 195 has approximate dimensions of 10.3×6.7 mm square by 0.5 mm thick. The heat spreader was larger than the die in the present embodiment. However, in some applications, the heat spreader may help provide thermal management even if it does not have a surface area larger than the surface area of the top of the IC (e.g., in certain applications, it may be advantageous to have the heat spreader surface area equal to the die top surface area).

A layer of thermal grease 200 is applied between the heat spreader 195 and the cover 185. The thermal grease thickness is approximately 0.05 mm and the thermal grease provides low thermal resistance while decoupling stress due to mismatched coefficients of thermal expansion between the heat spreader 195 and cover 185. A layer of thermally conductive, compliant epoxy 205 is applied between the semiconductor die 105 and the heat spreader 195. The epoxy layer thickness is approximately 0.025 mm and the epoxy provides low thermal resistance while decoupling stress due to mismatched coefficients of thermal expansion between the heat spreader 195 and the semiconductor die 105. As an example, adhesive model number 2600AT manufactured by Ablestik Inc. of Rancho Dominguez Calif., USA provides the desired properties.

Figure 4:
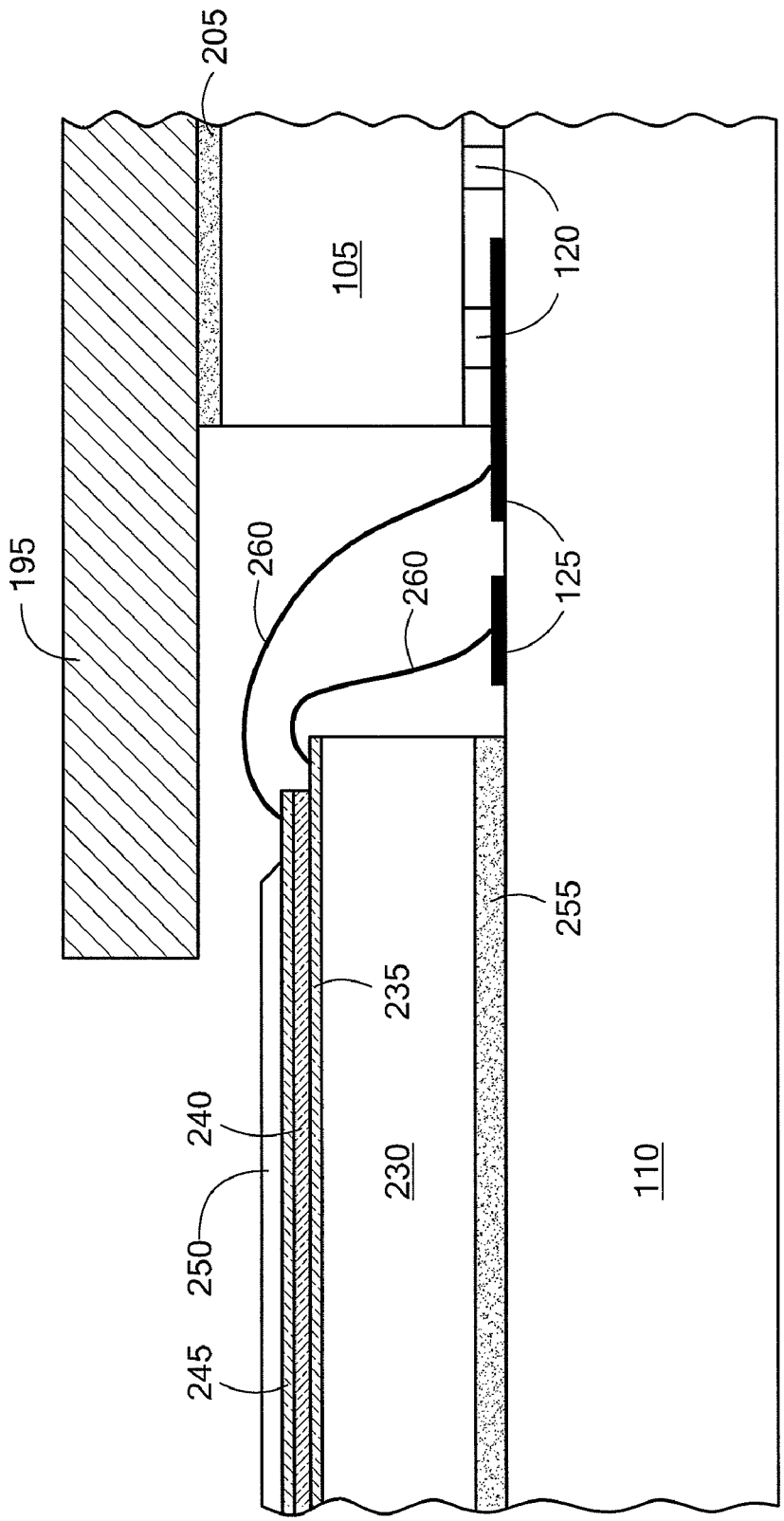
FIG. 4 illustrates an enlarged side section view of FIG. 3 taken through a planar capacitor according to one aspect of the present invention.

Referring to FIGS. 1 and 4, FIG. 4 shows a side section view of a planar capacitor. The microelectronic assembly 100 of FIG. 1 includes an array of seven decoupling capacitors 305, 310, 315, 320, 325, 330, 335 and two dual passive inductors 340 and 350. In a preferred embodiment, each decoupling capacitor comprises a "planar capacitor" and each passive inductor comprises a "planar inductor." In particular, each planar capacitor (FIG. 4) is formed on a flexible base substrate 230 such as a flexible polymer layer having a thickness of approximately 75 μm and having good thermal insulating properties. One such material used as a conventional flex-circuit substrate is sold by UBE Industries of Tokyo, Japan under the trade name UPILEX. Each planar capacitor comprises a bottom conductive layer 235, e.g. a thin metal film, applied over the flexible base substrate 230, a dielectric layer 240, applied over the bottom conductive layer 235, and a top conductive layer 245, e.g. a thin metal film, applied over the dielectric layer 240. In addition a passive overcoating layer 250 is applied over the top conductive layer 245.

In a preferred embodiment, the bottom conductive layer 235 and top conductive layer 245 comprise copper having an approximate thickness of 2 μm and the dielectric layer 240 comprises tantalum having an approximate thickness of 5 μm with anodized surfaces forming a thin layer of $TaO_5$ thereon. Each planar capacitor has a capacitance per unit area of approximately 100-200 $nF/cm^2$ such that the capacitance of individual planar capacitors is determined by a cross sectional area of the capacitor. According to the invention, individual capacitors 305, 310, 315, 320, 325, 330, 335 are formed with a cross sectional area corresponding with a desired capacitance value in nF and may be sized and shaped to fit together as a single layer of planar capacitors attached to the top surface of the package substrate 110. As an example, the capacitors 305, 310, 315, 320, 325, 330, 335 have capacitance values ranging from 12-112 nF. As further shown in FIG. 4, each planar capacitor may be attached to the package substrate 110 by a layer of adhesive 255 and electrically interconnected to the package substrate 110 by two or more wire ribbon conductors 260. Preferably the wire ribbon comprises gold wire ribbon having dimensions of 0.76×0.013 mm. Preferably each planar capacitor 305, 310, 315, 320, 325, 330, 335 is fabricated with less than 200 mΩ parasitic resistance and less that 5 nH parasitic inductance. Referring to FIG. 4, it is noted that the conductors 260 for electrically connecting the electrical component, here the capacitor 320, to the chip 105 through the package substrate 110 are disposed under an overhanging portion of the thermally conductive member 195. It is also noted that the conductors for electrically connecting the inductors 340, 350 (FIG. 1) to the chip 105 through the package substrate 110 also are disposed under an overhanging portion of the thermally conductive member 195. With such an arrangement, the capacitors and inductors can be positioned extremely close to the chip 105.

It is noted that the chip 105 is disposed in an inner region of the package while the passive elements (i.e., passive decoupling capacitors 305, 310, 315, 320, 325, 330 and 335, and inductors 340, 350) are disposed about an outer periphery of the chip 105. It is also noted that the conductors 235 and 245 provide the plates of the capacitors. As shown in FIG. 1, these capacitor plates' inner edges 311 are positioned very close to the chip 105 and have relatively short lengths; the surface area of the plates then flare outwardly so that the plates' outer edges 313 are longer in length than the lengths of the inner edges. Thus, relatively large capacitance capacitors are formed yet are close to the chip to enable the use of relatively short conductors 260 (FIG. 4).

By minimizing the gap between the capacitor plate and the chip, a relatively low parasitic inductance results from the interconnecting conductor(s) between the capacitor plate and the chip thereby enabling the chip to operate with higher clock rates. In order to shape the plates so that they can be positioned close to the chip and still provide a relatively large surface area to thereby increase capacitance, the width of the plates is increased as the plates extend from the gap region near the chip outwardly from the chip towards the outer peripheral region of the package. A higher capacitance results in increased charge that the capacitor can deliver and thus longer line voltage maintenance without excessive droop.

Figure 5:
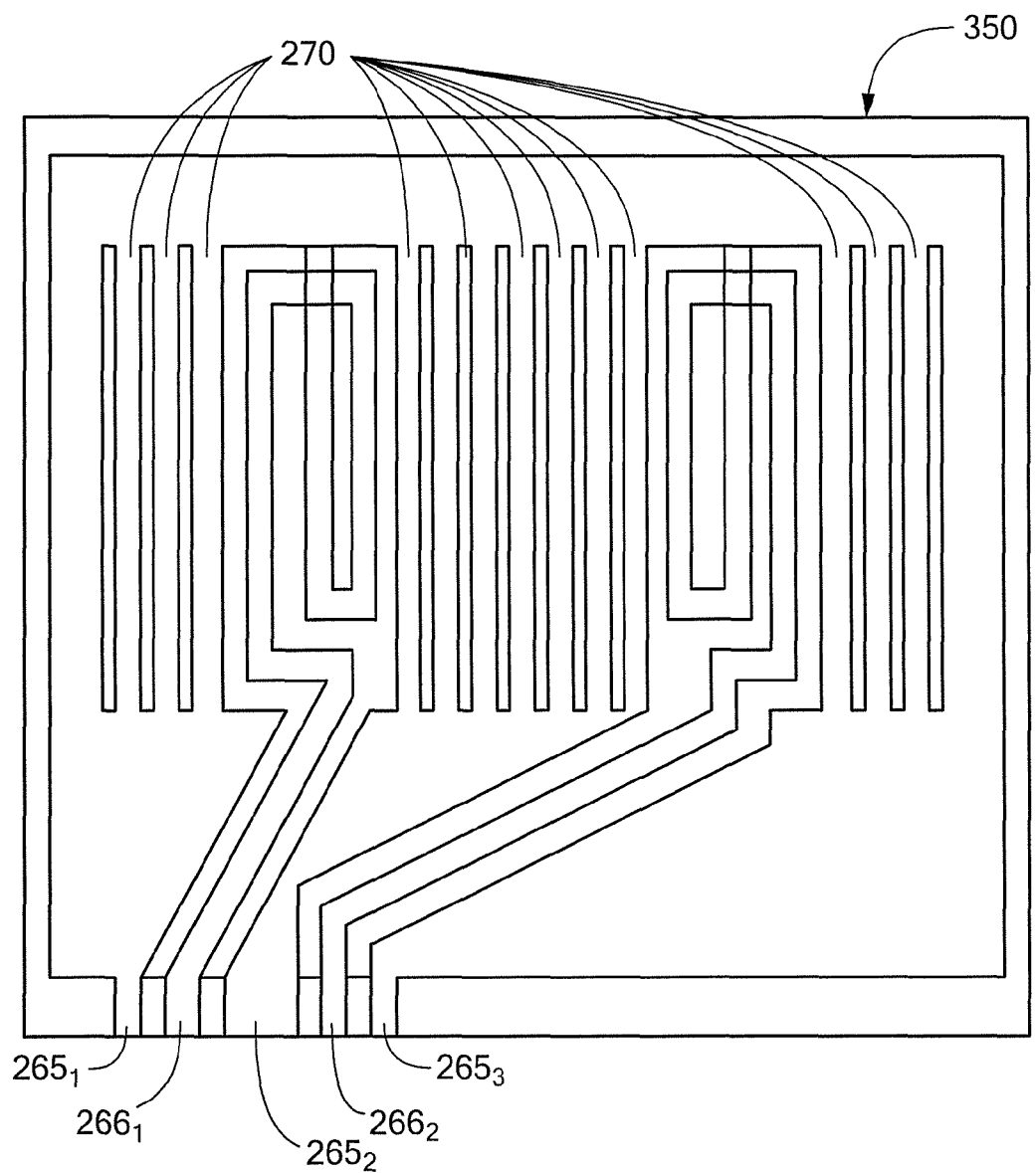
FIG. 5 illustrates a top view of a dual tunable planar inductor according to one aspect of the present invention.

Referring to FIG. 1, FIG. 4 and FIG. 5, the two dual planar inductors 340 and 350 are constructed on the flexible base substrate 230 described above. In addition, a dual planar inductor comprises a bottom conductive layer 235, e.g. 2 μm thick copper, applied over the flexible base substrate 230, an insulating layer 240, e.g. 4 μm thick Benzocyclobutene (BCB), applied over the bottom conductive layer 235, and a top conductive layer 245, e.g. 2 μm thick copper plated with nickel or gold. The planar inductors 340 and 350 may be electrically interconnected with the package substrate 110 by the wire ribbon conductor 260 described above, and the planar inductors may be attached to the package substrate 110 by an adhesive layer 255 shown in FIG. 4.

Referring to FIG. 5, dual planar inductor 350 is shown in top view; Dual planar inductor 340 is similar to Item 350. The two inductors within a dual planar inductor assembly are closely matched, and there is a common ground between the two inductors. Each dual planar inductor assembly, 340 or 350, includes two input terminals $266_1$, $266_2$ one for each inductor, and three ground terminals $265_1$, $265_2$, $265_3$. The five input and ground terminals are connected to the semiconductor die via top layer metal on the package substrate 110. The inductors and connected circuitry within the semiconductor die form resonant circuits to tune the mixed signal circuit to the correct operating frequency.

Preferably each inductor is designed for 3.0 nH and is adjustable to allow tuning of the resonant circuits. To achieve the tuning feature, the inductors in 340 and 350 include trim bars 270 that can be removed by laser trimming or otherwise to increase the inductance. The inductance can be lowered by shorting across the inductor spiral. Ideally, each planar inductor is fabricated with a quality factor greater than 50 and with a self resonance frequency of more than 8 GHz.

It will also be recognized by those skilled in the art that, while the invention has been described above in terms of preferred embodiments, it is not limited thereto. Various features and aspects of the above described invention may be used individually or jointly. Further, although the invention has been described in the context of its implementation in a particular environment, and for particular applications, e.g. as an analog to digital converter, those skilled in the art will recognize that its usefulness is not limited thereto and that the present invention can be beneficially utilized in any number of environments and implementations where it is desirable to reduce interconnection parasitics and decouple signal noise from an IC while simultaneously providing a high thermal conductivity solution. Accordingly, the claims set forth below should be construed in view of the full breadth and spirit of the invention as disclosed herein.

What is claimed is:

1. A microelectronic assembly comprising:
    a semiconductor die having one or more integrated circuits formed thereon;
    a package substrate for mechanically supporting the semiconductor die;
    a stiffening member comprising a continuous side wall forming an outer perimeter and an inner perimeter with the inner perimeter enclosing a hollow cavity surrounding the semiconductor die, and wherein the continuous side wall includes a side wall bottom surface fixedly attached to the package substrate and a side wall top surface separated from the bottom surface by a side wall thickness that exceeds a height of the semiconductor die;
    a cover fixedly attached to the side wall top surface for sealing the hollow cavity; and, a passive electrical component housed inside the hollow cavity and disposed on the package substrate and electrically interconnected to the semiconductor; and further comprises a heat spreader comprising a spreader bottom surface in thermal contact with the semiconductor die and a spreader top surface in thermal contact with the cover.

2. The microelectronic assembly of claim 1 wherein the heat spreader comprises a material having a thermal conductivity of more than 400 W/m° K at 20° C. and has a spreader cross-sectional area that exceeds a cross-sectional area of the semiconductor die.

3. The microelectronic assembly of claim 1 wherein the cover comprises a material having a thermal conductivity of more than 300 W/m° K at 20° C.

4. The microelectronic assembly of claim 1 further comprising:
a layer of thermal grease disposed between the heat spreader and the cover;
a layer of thermally conductive epoxy disposed between the heat spreader and the semiconductor die; and,
a layer of thermally conductive epoxy disposed between the cover and the side wall top surface.

5. The microelectronic assembly of claim 4 wherein the heat spreader comprises diamond and the cover comprises copper.

6. A microelectronic assembly comprising:
a semiconductor die having one or more integrated circuits formed thereon;
a package substrate for mechanically supporting the semiconductor die;
a stiffening member comprising a continuous side wall forming an outer perimeter and an inner perimeter with the inner perimeter enclosing a hollow cavity surrounding the semiconductor die, and wherein the continuous side wall includes a side wall bottom surface fixedly attached to the package substrate and a side wall top surface separated from the bottom surface by a side wall thickness that exceeds a height of the semiconductor die;
a cover fixedly attached to the side wall top surface for sealing the hollow cavity; and,
a passive electrical component housed inside the hollow cavity and disposed on the package substrate and electrically interconnected to the semiconductor; and
wherein the input signal comprises an analog signal having a signal amplitude varying at an average frequency of 500 MHz or more.

7. The microelectronic assembly of claim 6 wherein the integrated circuits have an operating frequency of 1 GHz or more.

8. A microelectronic assembly comprising:
a semiconductor die having one or more integrated circuits formed thereon;
a package substrate for mechanically supporting the semiconductor die;
a stiffening member comprising a continuous side wall forming an outer perimeter and an inner perimeter with the inner perimeter enclosing a hollow cavity surrounding the semiconductor die, and wherein the continuous side wall includes a side wall bottom surface fixedly attached to the package substrate and a side wall top surface separated from the bottom surface by a side wall thickness that exceeds a height of the semiconductor die;
a cover fixedly attached to the side wall top surface for sealing the hollow cavity; and,
a passive electrical component housed inside the hollow cavity and disposed on the package substrate and electrically interconnected to the semiconductor, and
wherein the package substrate includes a first conductive layer comprising a signal plane associated with the input signal and a second conductive layer comprising a ground plane and further wherein the passive electrical component comprises a planar capacitor connected in parallel between the signal plane and the ground plane.

9. The microelectronic assembly of claim 8 further comprising a planar inductor housed inside the hollow cavity and connected between a signal trace and the ground plane and wherein the planar inductor has a self resonance frequency that is greater than two times an operating frequency of the integrated circuits.

10. A microelectronic assembly comprising:
a semiconductor die having one or more integrated circuits formed thereon;
a package substrate for mechanically supporting the semiconductor die;
a stiffening member comprising a continuous side wall forming an outer perimeter and an inner perimeter with the inner perimeter enclosing a hollow cavity surrounding the semiconductor die, and wherein the continuous side wall includes a side wall bottom surface fixedly attached to the package substrate and a side wall top surface separated from the bottom surface by a side wall thickness that exceeds a height of the semiconductor die;
a cover fixedly attached to the side wall top surface for sealing the hollow cavity; and,
a passive electrical component housed inside the hollow cavity and disposed on the package substrate and electrically interconnected to the semiconductor; and
wherein the semiconductor die is configured as a flip chip having a plurality of stud bumps extending out from a bottom surface thereof for contacting the package substrate to mechanically support the semiconductor die on the package substrate and to electrically interconnect the semiconductor die with the package substrate.

11. The microelectronic assembly of claim 10 wherein the package substrate is configured as a ball grid array having a plurality of solder balls extending out from a bottom surface thereof for contacting an electrical system substrate to mechanically support the package substrate on the electrical system substrate and to electrically interconnect the package substrate with the electrical system substrate.

12. The microelectronic assembly of claim 4 wherein the semiconductor die is configured as a flip chip having a plurality of stud bumps extending out from a bottom surface thereof for contacting the package substrate to mechanically support the semiconductor die on the package substrate and to electrically interconnect the semiconductor die with the package substrate.

13. The microelectronic assembly of claim 12 wherein the package substrate is configured as a ball grid array having a plurality of solder balls extending out from a bottom surface thereof for contacting an electrical system substrate to mechanically support the package substrate on the electrical system substrate and to electrically interconnect the package substrate with the electrical system substrate.

14. The microelectronic assembly of claim 13 wherein the integrated circuits are configured to operate with a plurality of input power supply voltages simultaneously and wherein the package substrate includes one or more conductive power planes associated with each of the plurality of input supply voltages and further wherein the package substrate includes one or more conductive ground planes and further wherein the passive electrical component comprises a plurality of planar capacitors with each planar capacitor connected in parallel between a power plane and a ground plane.

15. The microelectronic assembly of claim 14 further comprising one or more planar inductors housed inside the hollow cavity and with each planar inductor connected between a signal run and one of the one or more ground planes and wherein each of the planar inductors has a self resonance frequency that is greater than two times an operating frequency of the integrated circuits.

16. The microelectronic assembly of claim 15 wherein the analog input signal has a signal amplitude varying at an average frequency of 1.0 GHz or more.

17. The microelectronic assembly of claim 16 wherein the integrated circuits have an operating frequency of 3.0 GHz or more.

18. A microelectronic assembly comprising:
a semiconductor chip;
a package substrate having electrical conductors therein and supporting the semiconductor chip;
wherein the chip has a bottom surface flip-chip mounted to the package substrate and electrically connected to the electrical conductors in the package substrate;
a thermally conductive member having a bottom surface in thermal contact with a back surface of the chip;
a side wall enclosing a hollow cavity surrounding the semiconductor chip and the thermally conductive member and wherein the side wall includes bottom surface fixedly attached to the package substrate and a top surface separated from the bottom; and
a cover fixedly attached to the top surface and disposed in thermal contact with a top surface of the thermally conductive member.

19. The package recited in claim 18 including a plurality of passive electrical components disposed on the package substrate, within the cavity, and spaced from the chip, such a plurality of passive electrical components being electrically connected to the chip and being disposed about a portion of the periphery of the chip.

20. The package recited in claim 18 wherein the top surface of the thermally conductive member has a surface area greater than the surface area of the bottom surface of the chip.

21. The package recited in claim 18 including a resilient, thermally conductive material disposed between the chip and the cover.

22. The package recited in claim 18 wherein the chip is flip chip mounted to a top surface of the package substrate and wherein the bottom surface of the package substrate has a ball grid array electrically connected to the electrical conductors in the package substrate.

23. The package recited in claim 19 wherein at least one of the passive electrical components is a capacitor.

24. The package recited in claim 19 wherein at least one of the passive electrical components is an inductor.

25. The package recited in claim 19 wherein at least one of the passive electrical components is a capacitor and at least another one of the passive electrical components is an inductor.

26. The package recited in claim 20 including a conductor for electrically connecting the passive component to the chip through the package substrate, and wherein a portion of the electrical conductor is disposed under a portion of the thermally conductive member.

27. The package recited in claim 19 wherein one of the passive elements is a capacitor and wherein this chip is disposed in an inner region of the cavity and wherein the capacitor increases in width from a relatively small width adjacent to the chip to a relatively larger width as the capacitor extends from such inner region outwardly towards an outer region of the cavity.

* * * * *